(12) United States Patent
Fukusho et al.

(10) Patent No.: US 7,259,791 B2
(45) Date of Patent: Aug. 21, 2007

(54) METHOD OF MAKING SOLID-STATE IMAGE PICKUP DEVICE IN-LAYER LENS WITH ANTIREFLECTION FILM WITH INTERMEDIATE INDEX OF REFRACTION

(75) Inventors: Takashi Fukusho, Kanagawa (JP); Atsushi Asai, Kanagawa (JP)

(73) Assignee: Sony Corporation, Tokyo (JP)

( * ) Notice: Subject to any disclaimer, the term of this patent is extended or adjusted under 35 U.S.C. 154(b) by 762 days.

(21) Appl. No.: 10/619,883

(22) Filed: Jul. 15, 2003

(65) Prior Publication Data
US 2004/0012707 A1 Jan. 22, 2004

Related U.S. Application Data

(62) Division of application No. 09/161,669, filed on Sep. 29, 1998, now Pat. No. 6,614,479.

(30) Foreign Application Priority Data
Sep. 29, 1997 (JP) .................................. 9-263037

(51) Int. Cl.
*H04N 5/225* (2006.01)
(52) U.S. Cl. ...................... 348/340; 348/272; 348/273; 250/216; 257/432; 438/69; 438/70
(58) Field of Classification Search ................ 348/272, 348/273, 335, 340; 250/208.1, 216, 214.1; 257/233, 432, 437; 438/69, 70
See application file for complete search history.

(56) References Cited

U.S. PATENT DOCUMENTS

| | | | |
|---|---|---|---|
| 5,654,565 A * | 8/1997 | Hokari | 257/222 |
| 5,691,548 A * | 11/1997 | Akio | 257/232 |
| 5,739,548 A * | 4/1998 | Shigeta et al. | 257/59 |
| 5,796,154 A * | 8/1998 | Sano et al. | 257/432 |
| 5,844,290 A * | 12/1998 | Furumiya | 257/432 |
| 5,976,907 A * | 11/1999 | Shigeta et al. | 438/65 |
| 6,030,852 A | 2/2000 | Sano et al. | |
| 6,157,017 A | 12/2000 | Kim | |
| 6,188,094 B1 | 2/2001 | Kochi et al. | |
| 6,252,219 B1 | 6/2001 | Abe | |
| 6,255,640 B1 | 7/2001 | Endo et al. | |
| 6,291,811 B1 | 9/2001 | Ogawa | |

* cited by examiner

*Primary Examiner*—David Ometz
*Assistant Examiner*—Chriss S. Yoder
(74) *Attorney, Agent, or Firm*—Sonnenschein Nath & Rosenthal LLP

(57) ABSTRACT

In a solid-state image pickup device including a light receiving sensor portion in a surface layer portion of a substrate, an in-layer lens disposed above the light receiving sensor portion, a color filter disposed on the in-layer lens, and an interlayer film disposed below the in-layer lens, an antireflection film is formed between the in-layer lens and the color filter, the antireflection film being formed of material having a refractive index which is an intermediate value between the refractive index of the in-layer lens and the refractive index of the color filter. Further, another antireflection film is formed between the in-layer lens and the interlayer film, the other antireflection film being formed of material having a refractive index which is an intermediate value between the refractive index of the in-layer lens and the refractive index of the interlayer film.

14 Claims, 3 Drawing Sheets

METHOD OF MAKING SOLID-STATE IMAGE PICKUP DEVICE IN-LAYER LENS WITH ANTIREFLECTION FILM WITH INTERMEDIATE INDEX OF REFRACTION

RELATED APPLICATION DATA

The present application claims priority to Japanese Application No. 9-263037, filed Sep. 29, 1997, and is a divisional of U.S. application Ser. No. 09/161,669, filed Sep. 29, 1998 now U.S. Pat. No. 6,614,479, both of which are incorporated herein by reference to the extent permitted by law.

BACKGROUND OF THE INVENTION

The present invention relates to a solid-state image pickup device which can increase light-gathering efficiency to a light receiving sensor unit to enhance the sensitivity characteristic thereof.

Recently, solid-state, image pickup devices have made further progress in a compact design and a high-density design of pixels, and this progress in the microstructure design has caused reduction in the light receiving area in which light is received, thereby inducing degradation of characteristics such as reduction in sensitivity, etc. As a countermeasure to the reduction in sensitivity, it has been proposed and practically used to provide an on-chip lens or an in-layer lens to enhance the light gathering efficiency at the light receiving sensor unit.

However, a solid-state image pickup device in which an in-layer lens is formed of material having high refractive index has the following problem.

In the case where the in-layer lens is formed of P—SiN having a refractive index of about 2.0 (silicon nitride based on the plasma CVD method), since a color filter layer formed on the in-layer lens usually has a refractive index of about 1.6, there is large difference in refractive index between the in-layer lens and the color filter layer, and thus reflection occurs at the interface between the in-layer lens and the color filter layer, so that the sensitivity characteristic is reduced. The reflection due to the difference in refractive index is inherently introduced from the wave equation.

An interlayer film which is subjected to a reflow treatment, etc. is formed under the in-layer lens, and BPSG (boron phosphorus silicate glass) having a refractive index of 1.45 or the like is normally used as the interlayer film because it is subjected to the reflow treatment, etc. Accordingly, as in the case of the refractive index difference between the in-layer lens and the color filter layer, the large difference in refractive index occurs between the in-layer lens and the interlay film and reflection also occurs at the interface therebetween, so that the sensitivity characteristic is reduced.

SUMMARY OF THE INVENTION

The present invention has been implemented in view of the foregoing situation, and has an object to provide a solid-state image pickup device which can prevent reflection between an in-layer lens and an upper layer or lower layer thereon or thereunder to enhance the light gathering efficiency, thereby enhancing the sensitivity.

In order to attain the above object, according to a first aspect of the present invention, a solid-state image pickup device comprises: a light receiving sensor portion which is provided in a surface layer portion of a substrate and performs photoelectric conversion; an in-layer lens which is provided in a layer above the light receiving sensor portion and converges incident light to the light receiving sensor portion, and a color filter layer which is provided through an antireflection film on the in-layer lens, wherein the antireflection film is formed of material having a refractive index which is an intermediate value between the refractive index of the in-layer lens and the refractive index of the color filter layer.

The solid-state image pickup device may further include a charge transfer portion which is provided in the surface layer portion of the substrate and transfers signal charge read out from the light receiving sensor portion, and a transfer electrode which is provided through an insulation film on the substrate so as to be located substantially just above the charge transfer portion.

The solid-state image pickup device may further include an on-chip lens at the upper side of the color filter layer.

The solid-state image pickup device may further include an interlayer film which is provided below the in-layer lens through another antireflection film below the in-layer lens, wherein the other antireflection film is formed of material having a refractive index which is an intermediate value between the refractive index of the in-layer lens and the refractive index of the interlayer film.

According to the solid-state image pickup device of the first aspect of the present invention, the upper antireflection film is formed between the color filter layer and the in-layer lens, the film being formed of the material having the refractive index which is an intermediate value between the refractive index of the color filter and the refractive index of the in-layer lens. Therefore, even when the difference in refractive index between the color filter layer and the in-layer lens is large, the color filter layer and the in-layer lens are not directly bonded to each other. Accordingly, there is no interface therebetween, and there exist only the interface between the color filter layer and the upper antireflection film, the refractive index difference of which is smaller than the refractive index difference between the color filter layer and the in-layer lens, and the interface between the upper antireflection film and the in-layer lens, the refractive index difference of which is also smaller than the refractive index difference between the color filter layer and the in-layer lens. Accordingly, by providing the upper antireflection film, the interface having a large refractive index difference is changed to the interface having a small refractive index difference, so that there does not occur any reflection which would occur if the interface having the large refractive index difference exists.

According to a second aspect of the present invention, a solid-state image pickup device includes: a light receiving sensor portion which is provided in a surface layer portion of a substrate and performs photoelectric conversion; an interlayer film formed on the light receiving sensor portion; and an in-layer lens which is provided on the interlayer film and converges incident light through an antireflection film to the light receiving sensor portion, wherein the antireflection film is formed of material having a refractive index which is an intermediate value between the refractive index of the in-layer lens and the refractive index of the interlayer film.

The solid-state image pickup device may further include a charge transfer portion which is provided in the surface layer portion of the substrate and transfers signal charge read out from the light receiving sensor portion, and a transfer electrode which is provided through an insulation film on the substrate so as to be located substantially just above the charge transfer portion.

The solid-state image pickup device may further include a color filter layer disposed above the in-layer lens.

The solid-state image pickup device may further include an on-chip lens disposed above the in-layer lens.

In the solid-state image pickup device, the color filter layer is provided through another antireflection film on the in-layer lens, and the other antireflection film is formed of material having a refractive index which is an intermediate value between the refractive index of the in-layer lens and the refractive index of the color filter layer.

According to the solid-state image pickup device of the second aspect of the present invention, the lower antireflection film is formed between the in-layer lens and the interlayer film, the lower antireflection film being formed of the material having the refractive index which is an intermediate value between the refractive index of the in-layer lens and the refractive index of the interlayer film. Therefore, even when the difference in refractive index between the in-layer lens and the interlayer film is large, the in-layer lens and the interlayer film are not directly bonded to each other. Accordingly, there is no interface therebetween and there exist only the interface between the lower antireflection film and the in-layer lens, the refractive index difference of which is smaller than the refractive index difference between the in-layer lens and the interlayer film, and the interface between the lower antireflection film and the interlayer film, the refractive index difference of which is also smaller than the refractive index difference between the in-layer lens and the interlayer film. Accordingly, by providing the lower antireflection film, the interface having a large refractive index difference is changed to the interface having a small refractive index difference, so that there does not occur any reflection which would occur if the interface having the large refractive index difference exists.

According to a third aspect of the present invention, a method of manufacturing a solid-state image pickup device comprises the steps of: forming in a surface layer portion of a substrate a light receiving sensor portion for performing photoelectric conversion, a charge transfer portion for transferring signal charge read-out from the light receiving sensor portion, and forming a transfer electrode through an insulation film substantially just above the charge transfer portion on the substrate; depositing an interlayer film so as to cover the transfer electrode; conducting a heat treatment under a predetermined condition to form a recess portion; and forming an antireflection film along the upper portion of the recess portion, wherein the antireflection film is formed of material having a refractive index which is an intermediate value between the refractive index of the in-layer lens and the refractive index of the interlayer film, and wherein the in-layer lens is formed on the antireflection film so that the lens material is filled in the recess portion, and then the surface thereof is flattened.

In the above method, a color filter layer may be formed above the in-layer lens.

In the above method, an on-chip lens may be formed above the in-layer lens.

The above method may further comprises the steps of forming another antireflection film on the in-layer lens, and forming a color filter layer on the other antireflection film, wherein the antireflection film is formed of material having a refractive index which is an intermediate value between the refractive index of the in-layer lens and the refractive index of the color filter layer.

DETAILED DESCRIPTION OF THE PREFERRED EMBODIMENT

A preferred embodiment according to the present invention will be described hereunder with reference to the accompanying drawings.

Figure 1:
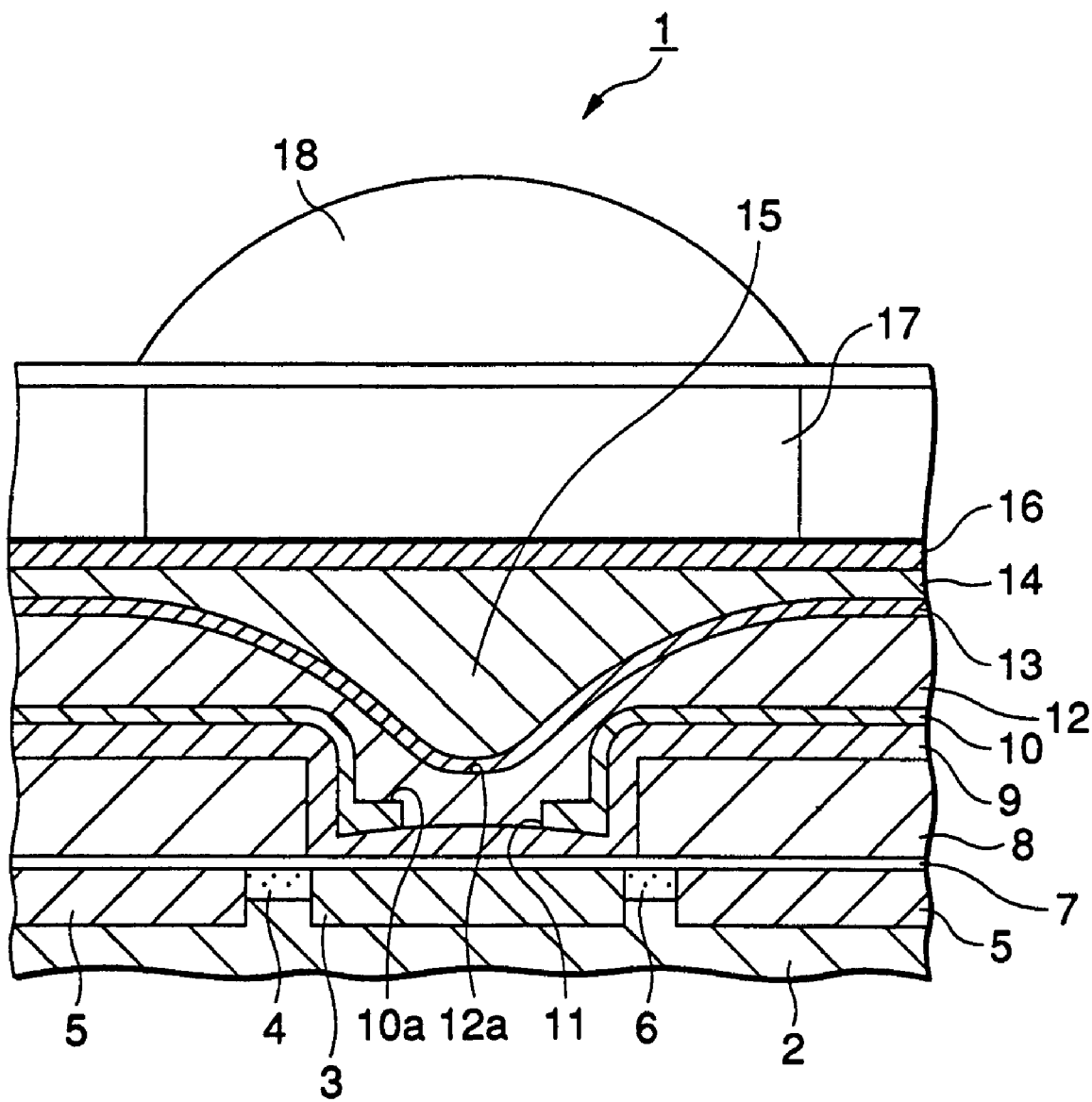
FIG. 1 is a cross-sectional view showing the construction of the main part of an embodiment of a solid-state image pickup device according to the present invention.

FIG. 1 shows an embodiment of a solid-state image pickup device according to the present invention. In FIG. 1, reference numeral 1 represents a solid-state image pickup device, and reference numeral 2 represents a silicon substrate (base). A light receiving portion (not shown) for performing photoelectric conversion is formed on the surface layer portion of the silicon substrate 2 shown in FIG. 1, and further a hole accumulation portion (not shown) is formed on the light receiving portion. The light receiving portion and the hole accumulation portion constitute a light receiving sensor portion 3 having HAD (hole accumulation diode) structure.

A charge transfer portion 5 is formed through a read-out gate 4 at one side of the light receiving sensor portion 3, and another charge transfer portion 5 is formed though a channel stop 6 on the other side of the light receiving sensor portion 3. With such a structure, signal charge which is obtained through the photoelectric conversion in the light receiving sensor portion 3 is read out through the read-out gate 4 to the charge transfer portion 5, and further transferred by the charge transfer portion 5.

Further, an insulation film 7 which is formed of $SiO_2$ by a thermal oxidation method, a CVD method or the like is provided on the surface portion of the silicon substrate 2. The insulation film 7 may be a laminate film having a so-called ONO structure comprising $SiO_2$ film-SiN film-$SiO_2$ film in place of a monolayer comprising an $SiO_2$ film.

A transfer electrode 8 of first polysilicon is formed substantially just above the charge transfer portion 5, and another transfer electrode of second polysilicon (not shown) is formed so as to be partially overlapped with the transfer electrode 8. Further, a layer insulation film 9 of $SiO_2$ is formed on the surfaces of the transfer electrodes 8, that is, the upper surfaces and the side surfaces thereof so as to cover the transfer electrodes 8 and the insulation film 7 on the light receiving sensor portion 3 which is exposed to the gap between the transfer electrodes 8.

A light shielding film 10 is formed on the layer insulation film 9 so as to cover the transfer electrodes 8. In order to prevent searing, a part of the light shielding film 10 forms an extension portion 10a which extends to the portion just above the light receiving sensor portion 3 so that most of the portion just above the light receiving sensor portion 3 is exposed to the outside, that is, the portion just above the light receiving sensor portion 3 is surrounded by the extension portion 10a so that a rectangular opening portion 11 is formed just above the light receiving sensor portion 3. Further, since the light shielding film 10 is subjected to a reflow treatment based on a thermal treatment after the light shielding film 10 is formed, but before an in-layer lens is formed as described later, the light shield film 10 is formed of metal having high melting point so as to prevent the light shielding film from being adversely affected by the reflow treatment. In this embodiment, tungsten (W) is used for the light shielding film 10.

Further, an interlayer film 12 of BPSG (refractive index: 1.45) is formed on the light shielding film 10 so as to cover the layer insulation film 9 exposed to the light shielding film and the opening portion 11. The interlayer film 12 functions as a reflow film, and covers the transfer electrodes 8, etc. to form a recess portion 12a on the light receiving sensor portion between the transfer electrodes 8. The recess portion 12a is processed through the reflow treatment of the interlayer film 12 to have a predetermined curvature which is suitable to form the in-layer lens.

A lower antireflection film 13 is formed on the interlayer film 12 so as to cover the surface of the interlayer film 12. The lower antireflection film 13 is formed of silicon oxide nitride (hereinafter referred to as "P—SiON") by the plasma CVD method, and the refractive index of the lower antireflection film 13 is adjusted to about 1.5 to 1.9, preferably to about 1.7. The lower antireflection film 13 is formed to have a thickness of about 50 to 300, preferably about 100 nm, so that the lower antireflection film 13 is formed as a thin film having a uniform thickness without losing the shape of the recess portion 12a of the interlayer film 12, thus without damaging the function of the in-layer lens as described later.

An in-layer lens member 14 is formed on the lower antireflection film 13 so as to be filled in the recess portion 12a of the interlayer film 12, whereby the in-layer lens 15 is formed between the in-layer lens member 14 and the interlayer film 12. The in-layer lens member 14 is formed of silicon nitride (hereinafter referred to as "P—SiN") by a bias high-density plasma CVD method, for example. The refractivity index of P—SiN is equal to 2.0, and thus there is the difference in refractive index between P—SiN and the lower antireflection film 13, that is, the interlayer film 12. Therefore, incident light is reflected to the light receiving sensor portion 3 at the interface between the in-layer lens member 14 and the lower antireflection film 13 and at the interface between the lower antireflection film 13 and the interlayer film 12, whereby the in-layer lens 15 is allowed to exhibit its function. The surface of the in-layer lens member 14 is flattened by a well-known resist etch-back method or CMP method (chemical mechanical polishing method).

Since the refractive index of the lower antireflection film 13 is equal to about 1.5 to 1.9, that is, it is set to an intermediate value between the refractive index (1.45) of the interlayer film 12 and the refractive index (2.0) of the in-layer lens member 14 (in-layer lens 15), the refractive index difference at the interface between the in-layer lens member 14 (in-layer lens 15) and the lower antireflection film 13 and the refractive index difference at the interface between the lower antireflection film 13 and the interlayer film 12 are set to be smaller than the refractive index difference between the in-layer lens member 14 and the interlayer film 12.

An upper antireflection film 16 is formed on the flattened in-layer lens member 14. The upper antireflection film 16 is formed of P—SiON as in the case of the lower antireflection film 13, and the refractive index thereof is equal to about 1.7 to 1.9, preferably to about 1.8 as described later. The upper antireflection film 16 also functions as a passivation film, and thus the thickness thereof is set to such a value that it sufficiently functions as the passivation film.

A color filter layer 17 is formed on the upper antireflection film 16. The color filter layer 17 is formed of resin or the like, and the refractive index thereof is equal to about 1.6.

Accordingly, as in the case of the above-described lower antireflection film 13, the refractive index of the upper antireflection film is set to about 1.7 to 1.9, that is, it is set to an intermediate value between the refractive index (1.6) of the color filter layer 17 and the refractive index. (2.0) of the in-layer lens member 14 (in-layer lens 15). Therefore, the refractive index difference at the interface between the color filter layer 17 and the upper antireflection film 16 and the refractive index difference at the interface between the upper antireflection film 16 and the in-layer lens member 14 (in-layer lens 15) are set to be smaller than the refractive index difference between the color filter layer 17 and the in-layer lens member 14.

Further, a convex on-chip lens 18 is formed of transparent resin or the like on the color filter layer 17. The on-chip lens 18 is formed of material having a refractive index of about 1.5 to 1.6, and it guides incident light through the in-layer lens 15 to the opening portion 11 of the light shielding film 10 so that the incident light is irradiated onto the light receiving sensor portion 3.

Figure 2A:
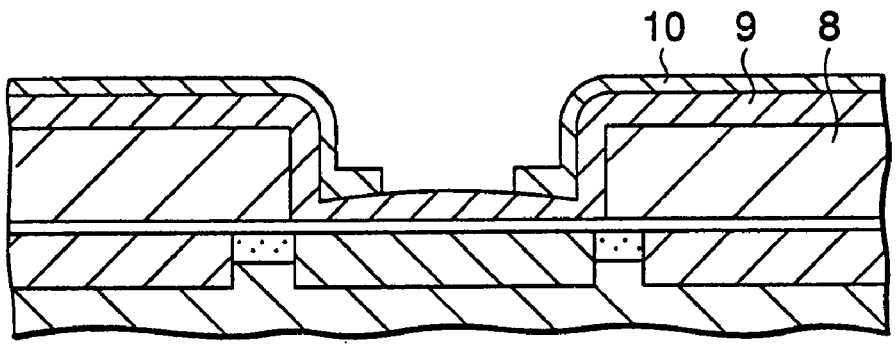
FIGS. 2A to 2F are cross-sectional views showing a series of manufacturing steps to manufacture the solid-state image pickup device according to the embodiment shown in FIG. 1.

In order to manufacture the solid-state image pickup device thus constructed, the transfer electrodes 8 are formed by the conventional method, then the layer insulation film 9 is formed so as to cover the transfer electrodes 8, and then the light shielding film 10 is formed (as shown in FIG. 2A). The light shielding film 10 may be formed as the same layer as wires of a peripheral circuit of the solid-state image pickup device 1.

Figure 2B:
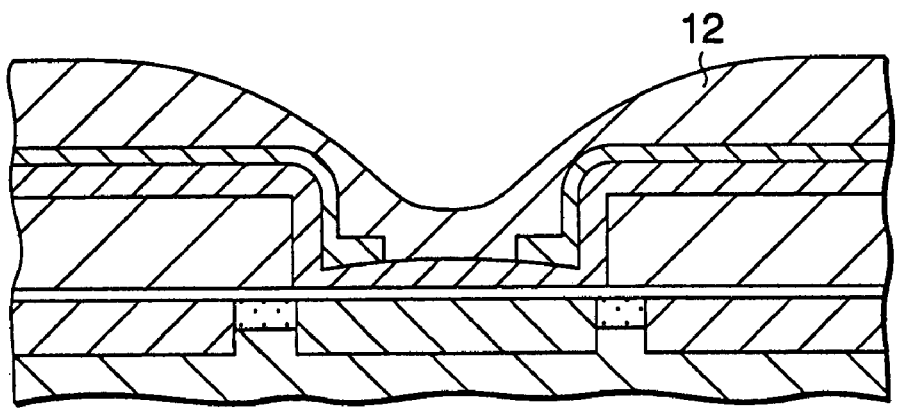

Subsequently, BPSG as the material of the interlayer film 12 is deposited by the CVD method or the like so as to cover the light shielding film 10, etc., and further subjected to the reflow treatment (heat treatment) under a preset condition, whereby the recess portion 12a is designed to have such a curvature that the in-layer lens 15 has a desired shape (FIG. 2B). For setting of the condition of the reflow treatment, the optimum shape of the in-layer lens 15 is predetermined by a simulation or the like, and further the condition for obtaining the optimum shape of the in-layer lens thus predetermined is determined by an experiment, a simulation or the like.

The optimum shape of the in-layer lens 15 is determined so that incident light which is incident to the in-layer lens 15 by the on-chip lens 18 can be suitably refracted in accordance with the incident position and the incident angle thereof in order to guide the incident light to the opening portion 11 of the light shielding film 10.

Figure 2C:
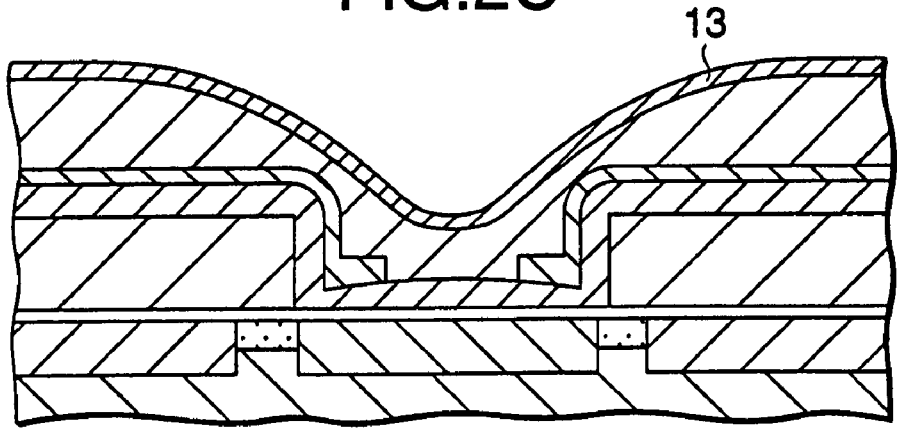

After the interlayer film 12 is formed as described above, the silicon oxide nitride (P—SiON) film is deposited at a thickness of about 50 to 300 nm under such a condition that the refractive index thereof is set to about 1.5 to 1.9, preferably to about 1.7 by the plasma CVD method, thereby forming the lower antireflection film 13 (FIG. 2C).

The adjustment of the refractive index is performed by suitably adjusting the flow amount ratio of $SiH_4$, $NH_3$ and $N_2O$ which are raw materials. That is, in the case where the flow amount ratio of $SiH_4$ is set as the reference value, the refractive index is increased as the flow amount ratio of $NH_3$ is increased, and it is reduced as the flow amount ratio of $N_2O$ is increased. This is because the number of Si—N bonds in P—SiON obtained is increased if the amount of $NH_3$ in the raw materials is increased while the number of Si—O bonds in P—SiON is increased if the amount of $N_2O$ in the raw materials is increased.

Figure 2D:
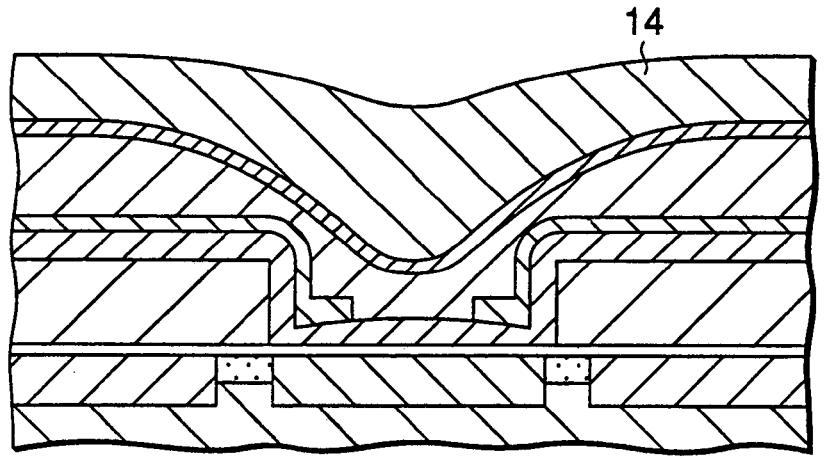
Figure 2E:
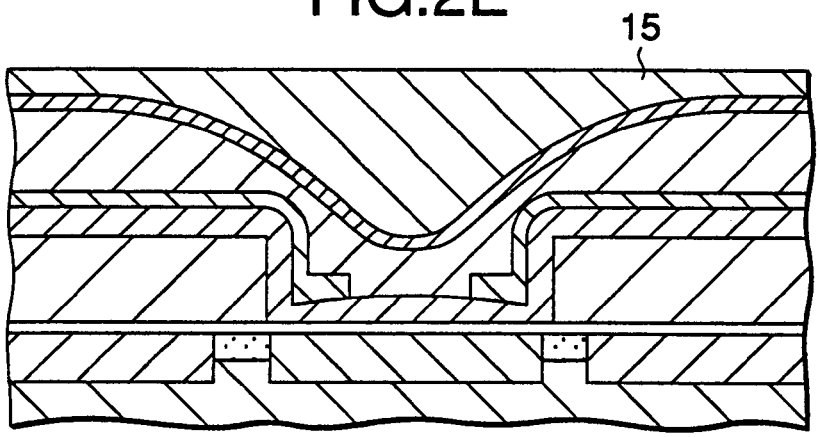

Accordingly, the relationship between the flow amount ratio of these raw materials and the refractive index of P—SiON may be determined in advance by an experiment or simulation, and then the condition for the formation of the lower antireflection film 13 is suitably selected in accordance with a desired refractive index. After the lower antireflection film 13 is formed as described above, the in-layer lens member 14 is deposited/formed while it is filled in the recess portion 12a of the interlayer film 12 (FIG. 2D), and then flattened by the resist etch-back method or the CMP method (chemical mechanical polishing method) to form the in-layer lens 15 (FIG. 2E).

Figure 2F:
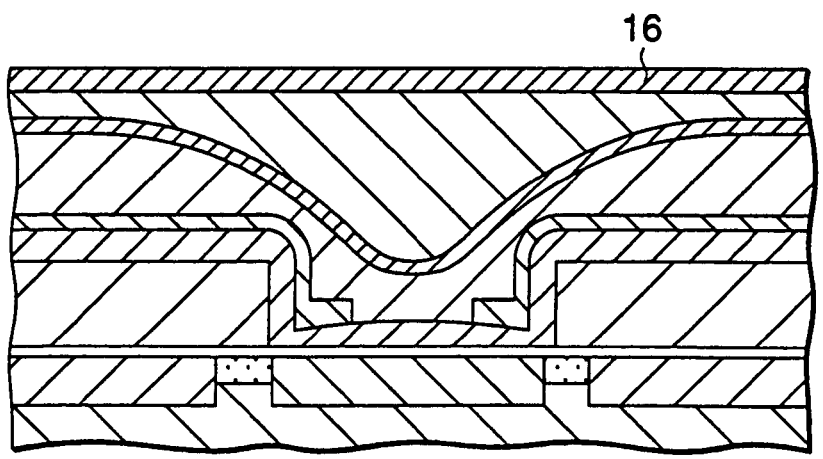

Subsequently, the silicon oxide nitride (P—SiON) is deposited on the flattened in-layer lens member 14 (in-layer lens 15) under such a condition as to have the refractive index of about 1.7 to 1.9, preferably about 1.8 by the plasma CVD method, thereby forming the upper antireflection film 16 (FIG. 2F). The adjustment of the refractive index is performed by suitably selecting the flow amount ratio of the raw material gas in the same manner as described above.

Subsequently, the color filter layer 17 is formed by a coloring method or a color resist coating method, and then the on-chip lens 18 is formed. Here, the formation of the on-chip lens 18 is performed by using the following etch-back transfer method or the like. That is, thermally fusible transparent resin or high-density SiN which can be subjected to chemical vapor deposition at normal temperature with no heat is deposited, and further a resist is formed thereon. Thereafter, the resist is subjected to a thermal reflow treatment to be shaped like a convex lens having a desired curvature. Thereafter, by using this resist as a mask, the deposition layer is etched, and then the resist is removed to obtain the on-chip lens 18.

In the solid-state image pickup device 1 thus obtained, the light is converged (gathered) by the on-chip lens 18, transmitted through the color filter layer 17 and the upper antireflection film 16 and then incident to the in-layer lens 15 to be gathered (refracted) again. The light thus gathered is passed through the lower antireflection film 13, incident to the opening portion 11 of the light shielding film 10, transmitted through the layer insulation film 9 and the insulation film 7 and then enters the light receiving sensor portion 3 to be subjected to the photoelectric conversion.

At this time, since the upper antireflection film 16 is provided, the interface between the color filter layer 17 and the in-layer lens 15 (in-layer lens member 14) and the interface between the upper antireflection film 16 and the in-layer lens 15 (in-layer lens member 14) exist between the color filter layer 17 and the in-layer lens 15 (in-layer lens member 14), so that the interface having a large refractive index difference is divided to the interfaces each having a small refractive index difference. Accordingly, the reflection which would occur if the interface having a large refractive index difference exists does not occur at that place. Therefore, the reflection which occurs between the color filter layer 17 and the in-layer lens 15 (in-layer lens member 14) in the prior art can be reduced, so that the light gathering efficiency can be enhanced and thus the sensitivity can be enhanced.

Further, since the lower antireflection film 13 is provided, the interface between the in-layer lens 15 (in-layer lens member 14) and the lower antireflection film 13 and the interface between the lower antireflection film 13 and the interlayer film 12 exist between the in-layer lens 15 and the interlayer film 12, so that the interface having a large refractive index difference is divided to the interfaces each having a small refractive index difference. Accordingly, the reflection which would occur between the in-layer lens 15 (in-layer lens member 14) and the interlayer film 12 if the interface having a large refractive index difference exists does not occur at that place. Therefore, the reflection which occurs between the color filter layer 17 and the in-layer lens 15 (in-layer lens member 14) in the prior art can be more greatly reduced, so that the light gathering efficiency can be enhanced and thus the sensitivity can be more enhanced.

In this embodiment, the upper antireflection film 16 is provided on the in-layer lens 15, and the lower antireflection film 13 is provided below the in-layer lens 15. However, the present invention is not limited to this mode. For example, only one of the upper antireflection film 16 and the lower antireflection film 13 may be provided.

According to the solid-state image pickup device and the solid-state image pickup method of the present invention, the upper antireflection film is formed between the color filter layer and the in-layer lens, the film being formed of the material having the refractive index which is an intermediate value between the refractive index of the color filter and the refractive index of the in-layer lens. Therefore, even when the difference in refractive index between the color filter layer and the in-layer lens is large, the color filter layer and the in-layer lens are not directly bonded to each other. Accordingly, there is no interface therebetween, and there exist only the interface between the color filter layer and the upper antireflection film, the refractive index difference of which is smaller than the refractive index difference between the color filter layer and the in-layer lens, and the interface between the upper antireflection film and the in-layer lens, the refractive index difference of which is also smaller than the refractive index difference between the color filter layer and the in-layer lens. Accordingly, the reflection occurring between the color filter layer and the in-layer lens in the prior art can be suppressed, whereby the light gathering efficiency can be enhanced and also the sensitivity of the solid-state image pickup device can be enhanced.

Further, according to the solid-state image pickup device and the solid-state image pickup method of the present invention, the lower antireflection film is formed between the in-layer lens and the interlayer film, the lower antireflection film being formed of the material having the refractive index which is an intermediate value between the refractive index of the in-layer lens and the refractive index of the interlayer film. Therefore, even when the difference in refractive index between the in-layer lens and the interlayer film is large, the in-layer lens and the interlayer film are not directly bonded to each other. Accordingly, there is no interface therebetween and there exist only the interface between the lower antireflection film and the in-layer lens, the refractive index difference of which is smaller than the refractive index difference between the in-layer lens and the interlayer film, and the interface between the lower antireflection film and the interlayer film, the refractive index difference of which is also smaller than the refractive index difference between the in-layer lens and the interlayer film. Accordingly, the reflection occurring between the in-layer lens and the interlayer film in the prior art can be suppressed, whereby the light gathering efficiency can be more enhanced and also the sensitivity of the solid-state image pickup device can be more enhanced.

What is claimed is:

1. A method of making a solid-state image pickup device comprising the steps of:
   providing in a surface layer portion of a substrate a light receiving sensor portion which performs photoelectric conversion;
   using a plasma CVD process, providing in a layer above said light receiving sensor portion an in-layer lens which converges incident light to said light receiving sensor portion; and using a plasma CVD process, providing an antireflection film on said in-layer lens; and providing a color filter over said antireflection film, wherein, said antireflection film is formed of material having a refractive index which is an intermediate value between the refractive index of said in-layer lens and the refractive index of said color filter.

2. The method of claim 1, comprising the further steps of providing a charge transfer portion which transfers signal charge read out from said light receiving sensor portion, and providing a transfer electrode which.

3. The method of claim 1, comprising the further step of: including an on-chip lens at the upper side of said color filter layer.

4. The method of claim 1, comprising the further step of including an interlayer film below said in-layer lens through another antireflection film below said in-layer lens, wherein said other antireflection film is formed of material having a refractive index which is an intermediate value between the refractive index of said in-layer lens and the refractive index of said interlayer film.

5. The method of claim 4 comprising the further step of providing an interlayer film between said light receiving sensor portion and said antireflection film, said antireflection film formed of material having a refractive index which is an intermediate value between the refractive index of said in-layer lens and the refractive index of said interlayer film.

6. The method of claim 5, comprising the further steps of: (a) including a charge transfer portion which is provided in the surface layer portion of said substrate and which transfers signal charge read out from said light receiving sensor portion, and (b) including a transfer electrode which is provided on an insulation film over said substrate so that said electrode is located substantially just above said charge transfer portion.

7. The method of claim 5, comprising the further step of including a color filter layer disposed above said in-layer lens.

8. The method of claim 7 comprising the further step of providing an on-chip lens disposed above said in-layer lens.

9. The method of claim 5, wherein said color filter layer is provided through another antireflection film on said in-layer lens, and said the other antireflection film is formed of material having a refractive index which is an intermediate value between the refractive index of said in-layer lens and the refractive index of said color filter layer.

10. A method of making a solid-state image pickup device comprising the steps of:

providing in a surface layer portion of a substrate a light receiving sensor portion which performs photoelectric conversion;

providing an interlayer film on said light receiving sensor portion; and using a plasma CVD process, providing on said interlayer film an in-layer lens and antireflection film which converges incident light through said antireflection film onto said light receiving sensor portion, wherein, said antireflection film is formed of material having a refractive index is an intermediate value between the refractive index of said in-layer lens and the refractive index of said interlayer, and said in-layer lens and said antireflection film are formed by plasma CVD method.

11. The method of claim 10 comprising the further steps of: (a) providing in the surface layer portion of said substrate a charge transfer portion which transfers signal charge read out from said light receiving sensor portion, and (b) providing a transfer electrode and an insulation film on said substrate such that the transfer electrode is located substantially just above said charge transfer portion.

12. The method of claim 10 comprising the further step of providing a color filter layer disposed above said in-layer lens.

13. The method of claim 12 comprising the further step of providing another antireflection film on said in-layer lens over which said color filter is provided, and said the other antireflection film is formed of material having a refractive index which is an intermediate value between the refractive index of said in-layer lens and the refractive index of said color filter layer.

14. The method of claim 10 comprising the further step of providing an on-chip lens disposed above said in-layer lens.

* * * * *